US008655296B2

(12) United States Patent
Deleon (10) Patent No.: US 8,655,296 B2
(45) Date of Patent: *Feb. 18, 2014

(54) FREQUENCY SYNTHESIZER AND RELATED METHOD FOR GENERATING WIDEBAND SIGNALS

(75) Inventor: Amilcar Deleon, Rochester, NY (US)

(73) Assignee: Harris Corporation, Melbourne, FL (US)

( * ) Notice: Subject to any disclaimer, the term of this patent is extended or adjusted under 35 U.S.C. 154(b) by 787 days.

This patent is subject to a terminal disclaimer.

(21) Appl. No.: 11/958,641

(22) Filed: Dec. 18, 2007

(65) Prior Publication Data

US 2009/0156150 A1   Jun. 18, 2009

(51) Int. Cl.
*H04B 1/16* (2006.01)

(52) U.S. Cl.
USPC ......... 455/260; 455/147; 455/252.1; 455/255

(58) Field of Classification Search
USPC .............................................. 455/260
See application file for complete search history.

(56) References Cited

U.S. PATENT DOCUMENTS

| 4,105,949 | A |   | 8/1978  | Hardin ............................ 331/37 |
| 4,969,210 | A |   | 11/1990 | Hansen et al. ................. 455/188 |
| 5,200,826 | A | * | 4/1993  | Seong ............................ 348/731 |
| 5,781,600 | A | * | 7/1998  | Reeve et al. .................... 375/376 |
| 5,854,575 | A |   | 12/1998 | Fiedler et al. .................... 331/10 |
| 5,973,570 | A |   | 10/1999 | Salvi et al. ...................... 331/16 |
| 6,163,184 | A |   | 12/2000 | Larsson ......................... 327/156 |
| 6,212,975 | B1 | * | 4/2001  | Cook ........................... 73/861.22 |
| 6,281,935 | B1 |   | 8/2001  | Twitchell et al. ............. 348/470 |
| 6,335,766 | B1 |   | 1/2002  | Twitchell et al. ............. 348/608 |
| 6,359,950 | B2 |   | 3/2002  | Gossmann et al. ........... 375/376 |
| 6,556,087 | B2 |   | 4/2003  | Ichimaru ......................... 331/10 |
| 6,660,912 | B1 |   | 12/2003 | Owen ............................ 455/313 |
| 7,259,643 | B2 | * | 8/2007  | Son et al. ....................... 333/174 |
| 7,268,633 | B2 |   | 9/2007  | Von Kaenel ..................... 331/17 |
| 7,279,993 | B2 |   | 10/2007 | Bruno et al. ..................... 331/34 |
| 7,495,496 | B2 | * | 2/2009  | Zhang et al. ................... 327/291 |
| 7,541,849 | B2 | * | 6/2009  | Shigemori et al. ............ 327/156 |
| 7,653,152 | B2 | * | 1/2010  | Al-Eidan ....................... 375/334 |
| 7,907,924 | B2 | * | 3/2011  | Kawasaki .................. 455/252.1 |
| 7,974,333 | B2 | * | 7/2011  | Maeda ............................ 375/222 |
| 2002/0081983 | A1 |   | 6/2002  | Brunel et al. .................. 455/130 |
| 2003/0132820 | A1 | * | 7/2003  | Shamsaifar et al. .......... 333/205 |

(Continued)

FOREIGN PATENT DOCUMENTS

DE   19946494      9/1999
WO   2005/107059   11/2005

(Continued)

OTHER PUBLICATIONS

D. Banerjee, "*PLL Performance, Simulation, and Design*," National Semiconductor, 1998, pp. 1-123.

*Primary Examiner* — Ajibola Akinyemi (74) *Attorney, Agent, or Firm* — Allen, Dyer, Doppelt, Milbrath & Gilchrist, P.A.

(57) ABSTRACT

A frequency synthesizer includes a phase-locked loop circuit having an output. A frequency divider is connected to the output of the phase-locked loop circuit for receiving the signal therefrom and dividing the frequency of the signal. A tunable bandpass filter is connected to the frequency divider and is tuned for selecting a harmonic frequency to obtain a fractional frequency division for a signal output from the phase-locked loop circuit.

11 Claims, 6 Drawing Sheets

(56) References Cited

U.S. PATENT DOCUMENTS

| | | | |
|---|---|---|---|
| 2003/0155981 A1* | 8/2003 | Dey | 331/16 |
| 2004/0027205 A1 | 2/2004 | Fikart et al. | 331/11 |
| 2005/0245200 A1 | 11/2005 | Kluge et al. | 455/76 |
| 2008/0291983 A1* | 11/2008 | Myers | 375/219 |
| 2010/0007426 A1* | 1/2010 | Ricketts et al. | 331/107 T |

FOREIGN PATENT DOCUMENTS

| | | | |
|---|---|---|---|
| WO | 2006/095283 | | 9/2006 |
| WO | WO2007/004465 | * | 1/2007 |
| WO | 2007/083635 | | 7/2007 |

* cited by examiner

FREQUENCY SYNTHESIZER AND RELATED METHOD FOR GENERATING WIDEBAND SIGNALS

FIELD OF THE INVENTION

The present invention relates to frequency synthesizers, and more particularly, this invention relates to frequency synthesizers that use phase-locked loops (PLLs) and voltage controlled oscillators (VCOs), for example, in communications systems, including analog and digital television communications systems.

BACKGROUND OF THE INVENTION

Phase-locked loop circuits incorporate a voltage controlled oscillator (VCO) in which the output of the VCO is fed back through a frequency divider as a divide-by-N circuit to an input of a phase detector, i.e., phase comparator. A constant frequency reference signal is applied to the phase detector from a reference source such as a crystal oscillator. A reference frequency divider is often used to reduce the frequency of the reference signal to the same frequency as the voltage controlled oscillator and/or impart a desired channel spacing. The frequency of the output signal from the voltage controlled oscillator can be changed by changing the ratio "N" of the divide-by-N circuit in a predetermined manner.

These types of frequency synthesizers are commonly used in communications systems, including commercial television systems, which often require the use of wideband low phase noise signals for television systems such as disclosed in commonly assigned U.S. Pat. Nos. 6,281,935 and 6,335,766, the disclosures which are hereby incorporated by reference in their entirety. These systems require the frequency of a transmitted signal to be controlled such that the frequency of the signal received at a transmitter is error corrected before being broadcast as a television signal. A pilot frequency signal is typically added to the signal to be broadcast after the signal has been shaped and filtered. The frequency of the RF signal is controlled by compensating for errors in the signal received from the system. Typically, a digital television transmitter for such systems uses an exciter circuit that receives a digital data stream corresponding to digital television signals and formats the digital data stream and converts the formatted digital stream into analog form in accordance with digital television standards. A power amplifier includes a mixer and modulates the digital television signals in analog form with a carrier frequency. A frequency control circuit controls the frequency of the bandwidth of the modulated carrier signals.

One possible drawback of such systems is the carrier on an adjacent channel could be off by a certain amount, for example, three (3) Hz and the pilot signal must be contained within that drift. It is desirable to lock at the frequency to obtain the final frequency such as by using a phase-locked loop and voltage controlled oscillator.

To generate wideband low phase noise signals is difficult because as the bandwidth is increased, the "Q" of the resonator is lowered to increase the pull range. As the "Q" is lowered, however, the phase noise of the generated signal is increased. Some prior art solutions have band split the frequencies so that a single voltage controlled oscillator does not cover the whole frequency band. This is costly, however, and requires a lot of board space and requires switching and multiple voltage controlled oscillators and phase-locked loops with the associated circuits such as loop filters, power supply filters and associated components for the phase-locked loop and voltage controlled oscillators and other components. There have been some techniques to lower phase noise by splitting the entire frequency band into smaller bands such that the voltage controlled oscillator does not cover a wide bandwidth using a band split phase-locked loop.

SUMMARY OF THE INVENTION

A frequency synthesizer includes a phase-locked loop circuit having an output. A frequency divider is connected to the output of the phase-locked loop circuit for receiving the signal therefrom and dividing the frequency of the signal. A tunable bandpass filter is connected to the frequency divider and turned to a harmonic frequency thus obtaining an integer or a fractional frequency division for a signal output from the phase-locked loop circuit. This allows a narrow band VCO to completely cover a wide range of frequencies and thus resulting in a lower phase noise output.

The frequency synthesizer includes a tunable bandpass filter that is operative for selecting either the fundamental frequency or a harmonic frequency. The frequency divider is operative for dividing the frequency output from the phase-locked loop by an integer number such that after selection by the tunable bandpass filter, either an integer or a fractional division is accomplished.

The tunable bandpass filter can be formed as a plurality of serially connected and tunable bandpass filters. A bandpass filter selects circuits and can be operatively connected to each of the tunable bandpass filters for controlling the bandpass filters and tuning the bandpass filter to a harmonic frequency.

In yet another aspect, a variable attenuator is connected to the tunable bandpass filter and operable with the tunable bandpass filter for shaping the signal. The phase-locked loop circuit can also be formed as a phase detector, voltage controlled oscillator and N frequency divider in feedback from an output of the voltage controlled oscillator to the phase detector. The reference signal source and reference frequency divider connected to the phase detector can impart a desired channel spacing.

The frequency synthesizer can include dual channels or circuit paths, each having a phase-locked loop circuit to produce local oscillator signals. A frequency divider and tunable bandpass filter are positioned after the first phase-locked loop circuit and a direct digital synthesizer circuit is positioned after the second phase-locked loop circuit.

A method aspect is also set forth.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

Different embodiments will now be described more fully hereinafter with reference to the accompanying drawings, in which preferred embodiments are shown. Many different forms can be set forth and described embodiments should not be construed as limited to the embodiments set forth herein. Rather, these embodiments are provided so that this disclosure will be thorough and complete, and will fully convey the scope to those skilled in the art.

It should be appreciated by one skilled in the art that the approach to be described is not limited for use with any particular communication standard (wireless or otherwise) and can be adapted for use with numerous wireless (or wired) communications standards such as Enhanced Data rates for GSM Evolution (EDGE), General Packet Radio Service (GPRS) or Enhanced GPRS (EGPRS), extended data rate Bluetooth, Wideband Code Division Multiple Access (WCDMA), Wireless LAN (WLAN), Ultra Wideband (UWB), coaxial cable, radar, optical, etc. Further, the invention is not limited for use with a specific PHY or radio or television type but is applicable to other compatible technologies as well.

Throughout this description, the term communications device or system is defined as any apparatus or mechanism adapted to transmit, receive or transmit and receive data through a medium. The communications device may be adapted to communicate over any suitable medium such as RF, wireless, infrared, optical, wired, microwave, etc. In the case of wireless communications, the communications device may comprise an RF transmitter, RF receiver, RF transceiver or any combination thereof. Wireless communication involves: radio frequency communication; microwave communication, for example long-range line-of-sight via highly directional antennas, or short-range communication; and/or infrared (IR) short-range communication. Applications may involve point-to-point communication, point-to-multipoint communication, broadcasting, cellular networks and other wireless networks.

As will be appreciated by those skilled in the art, a method, data processing system, or computer program product can embody different examples in accordance with a non-limiting example of the present invention. Accordingly, these portions may take the form of an entirely hardware embodiment, an entirely software embodiment, or an embodiment combining software and hardware aspects. Furthermore, portions may be a computer program product on a computer-usable storage medium having computer readable program code on the medium. Any suitable computer readable medium may be utilized including, but not limited to, static and dynamic storage devices, hard disks, optical storage devices, and magnetic storage devices.

The description as presented below can apply with reference to flowchart illustrations of methods, systems, and computer program products according to an embodiment of the invention. It will be understood that blocks of the illustrations, and combinations of blocks in the illustrations, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, implement the functions specified in the block or blocks.

These computer program instructions may also be stored in a computer-readable memory that can direct a computer or other programmable data processing apparatus to function in a particular manner, such that the instructions stored in the computer-readable memory result in an article of manufacture including instructions which implement the function specified in the flowchart block or blocks. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions specified in the flowchart block or blocks.

The frequency synthesizer, in accordance with a non-limiting example of the present invention, includes a phase-locked loop (PLL) circuit and voltage controlled oscillator (VCO). This frequency synthesizer is an improvement over a frequency synthesizer that uses a low bandwidth voltage controlled oscillator and divides it by an integer number (N), but still had gaps in the frequency coverage and thus does not cover an entire frequency range.

The frequency synthesizer, in accordance with a non-limiting example of the present invention, fills this gap by introducing a fractional division scheme. For example, if the frequency synthesizer divides by an integer number, i.e., 3, and then removes a fundamental frequency, for example, by using a tunable bandpass filter, the second harmonic is left intact and a 1.5 division is accomplished. This frequency synthesizer fills the gaps generated by integer division and provides a complete coverage of desired frequency range. The division also provides a phase noise improvement because narrow band Voltage Controlled Oscillators have lower phase noise than wide band Voltage Controlled Oscillators. A lower harmonic content of the output signal is generated because of the use of the tunable bandpass filter.

The frequency synthesizer uses a narrow band voltage controlled oscillator to create a low phase noise, wideband signal. It uses less space and costs less. The frequency synthesizer uses a fractional division system. By selectively filtering a harmonic frequency, the frequency synthesizer achieves integer or fractional division of the frequency. The low harmonic content of the output alleviates the local oscillator radiation from the mixer stages. A faster locking time is provided and the frequency synthesizer is simpler than multiple loop schemes.

Figure 1A:
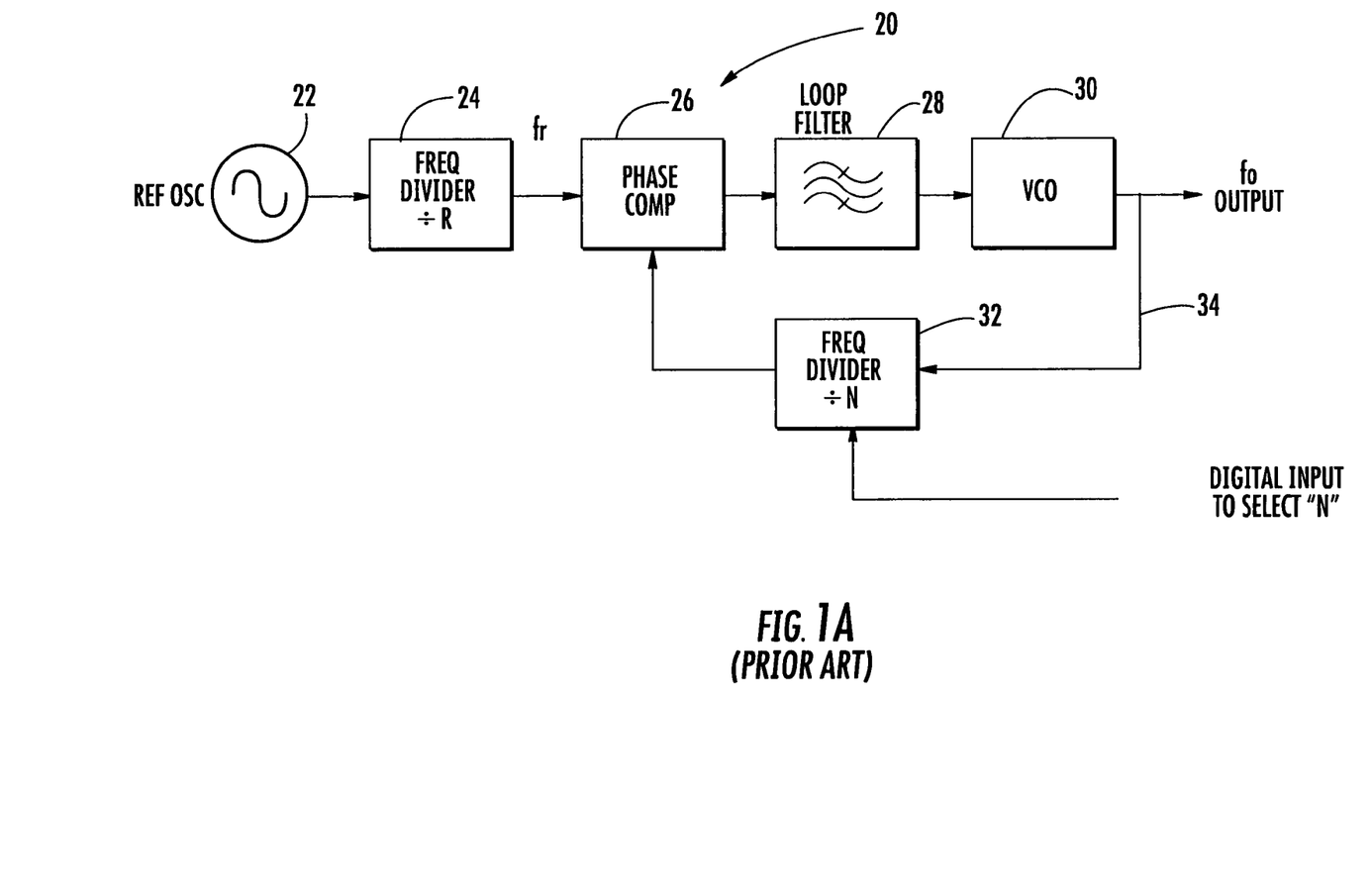
FIG. 1A is a block diagram of a prior art frequency synthesizer using a phase-locked loop and voltage controlled oscillator.

Referring now to FIG. 1A, a prior art phase-locked loop frequency synthesizer 20 is described as background for a better understanding of phase-locked loop frequency synthesizers to have a better appreciation of the frequency synthesizer, in accordance with a non-limiting example of the present invention. As illustrated, a reference oscillator 22 outputs a reference signal into a reference frequency divider 24 and phase comparator 26, i.e., phase detector, loop filter 28, and voltage controlled oscillator (VCO) 30. A signal is output at a frequency fo. A "N" frequency divider 32 is placed in the feedback loop 34 from the VCO 30 into the phase comparator 26 as illustrated.

It should be understood that this type of phase-locked loop as described is typically operative for frequency control similar to how an Automatic Gain Control (AGC) circuit is operative for voltage control. The PLL circuit 20 compares the frequencies of two signals and produces an error signal that is proportional to the difference between input frequencies. This error signal drives the voltage controlled oscillator and creates an output frequency fo, which is fed back through the frequency divider into the input of the system at the phase comparator, producing a negative feedback loop. The error signal can increase if the output frequency drifts, causing the output to be locked to the frequency at the input.

Multiple frequencies can be generated with the use of the divider placed between the output and feedback input creating a frequency synthesizer as illustrated. This circuit could include a digital counter with an output signal acting as a clock signal. The counter can count down at each cycle of a clock signal as it is preset to some initial count value. That circuit can be implemented using flip-flops and can interface with other digital components, for example, a microprocessor. The loop filter provides some control over the amount of time the system switches from channel-to-channel and the time used to lock when the frequency synthesizer is first switched on.

The frequency synthesizer 20 can be formed as a single integrated circuit (IC) and could include a blend of digital and analog techniques in one IC package. As noted before, the phase detector, i.e., phase comparator 26, compares two input frequencies and generates an output that is a measure of the phase difference to produce a periodic output as the difference frequency. When the voltage controlled oscillator 30 locks to the input frequency, it maintains a fixed relationship. The reference frequency divider 24 divides the reference signal from the reference oscillator 22 by "R" for channel spacing or adjusting the frequency to the VCO 30. The reference oscillator 22 can be a crystal oscillator.

The filtered output of the phase detector 26 is typically a DC signal and the control input to the VCO 30 is typically a measure of the output frequency. The VCO output could be a triangular wave, sine wave or any other type of substantially configured sine waveform locked to a train of pulses. It is possible to place a modulo-N counter between the VCO 30 output and the phase detector 26 and generate a multiple of the input reference frequency.

The phase detector, i.e., phase comparator 26, is operable similar to a discriminator or ratio detector used in frequency demodulators and could be formed as an exclusive OR gate circuit. When two signals are fed and equal in phase and frequency, there is no output from the comparator, but if the signals are not in phase and frequency, the difference is converted to a DC output signal, which is greater in voltage when the frequency/phase difference in the two signals is greater.

In order to ensure that the VCO 30 does not behave as a fixed frequency oscillator when it locks onto the fixed reference signal from the crystal oscillator, flexibility is established by feedback from the voltage controlled oscillator 30 through the N frequency divider 32 into the phase comparator 26. The digital input to the frequency divider provides for a different divide-by-"N" amount. Control over the divide can be provided by a digital input and control of some type to select a value for "N." This value can be an integer or a fractional value. If the value of N can only be an integer the PLL is called "Integer N PLL", if the value on N can be an integer or a fraction, the PLL is called "Fractional N PLL".

Different types of phase detectors 26 can be used such as a Type I and Type II phase detectors known to those skilled in the art. The phase detector 26 could be sensitive to the relative timing of edges between the signal and the VCO input in different systems.

Figure 1B:
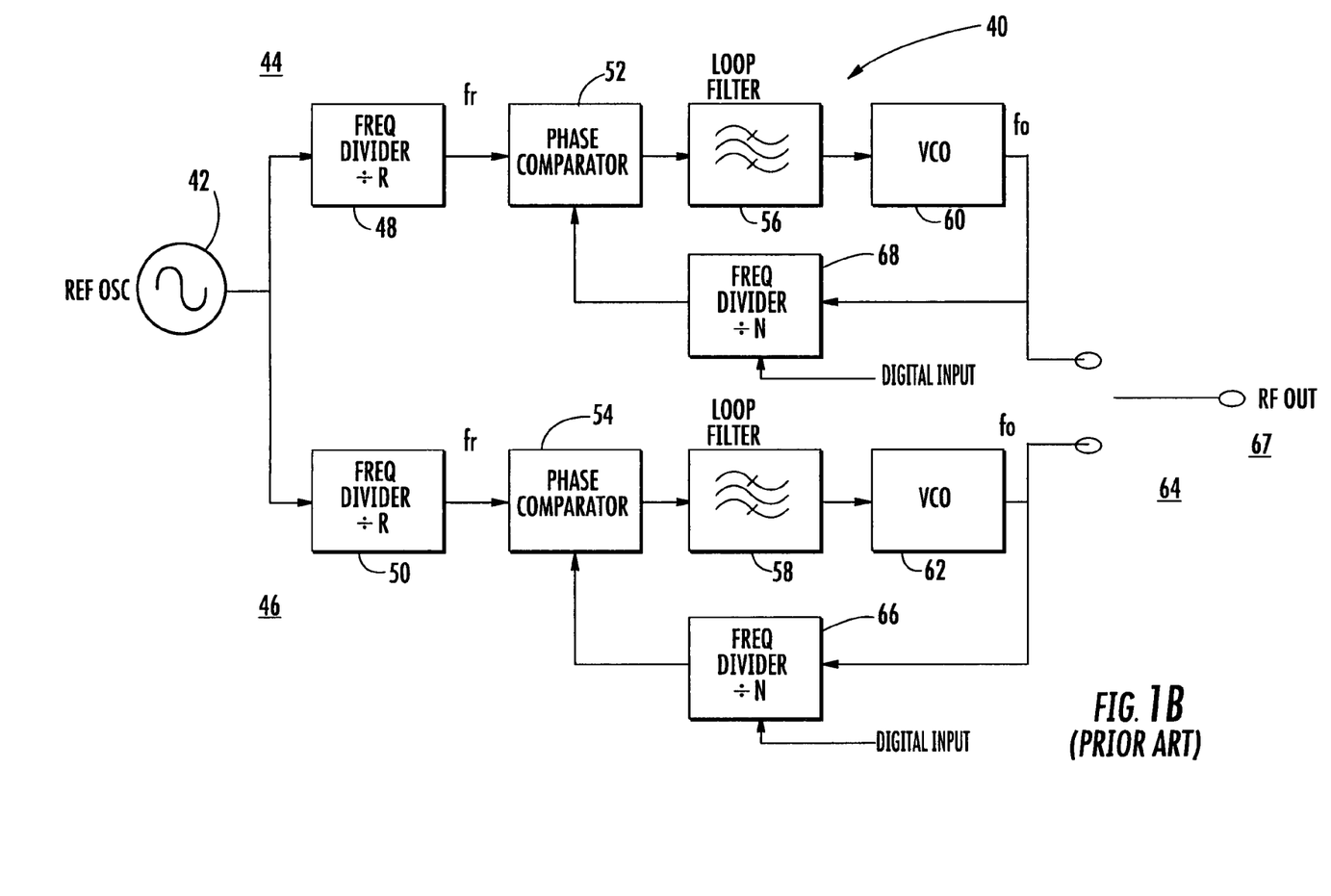
FIG. 1B is another block diagram of a band split phase-locked loop circuit for a frequency synthesizer that obtains a lower phase noise by splitting the frequency band into smaller bands such that one voltage controlled oscillator does not cover a wide bandwidth.

Referring now to FIG. 1B, a block diagram of a prior art frequency synthesizer is illustrated that operates as a band split phased locked loop frequency synthesizer 40 that splits the entire frequency band into smaller bands (two as illustrated) so that the voltage controlled oscillator does not have to cover a wide bandwidth. An improvement in phase noise is accomplished by choosing a low bandwidth voltage controlled oscillator over a Wide bandwidth voltage controlled oscillator.

As illustrated, the signal from reference oscillator 42 is split into two circuit paths and passes through two different frequency synthesizer circuits 44, 46. Each includes a reference frequency divider 48, 50, phase comparator 52, 54, loop filter 56, 58, VCO 60, 62 and N frequency divider 64, 66 in the feedback. The signals are selected depending on which band output is desired at output switch 64 and at 67 a single radio frequency signal is output.

Figure 2:
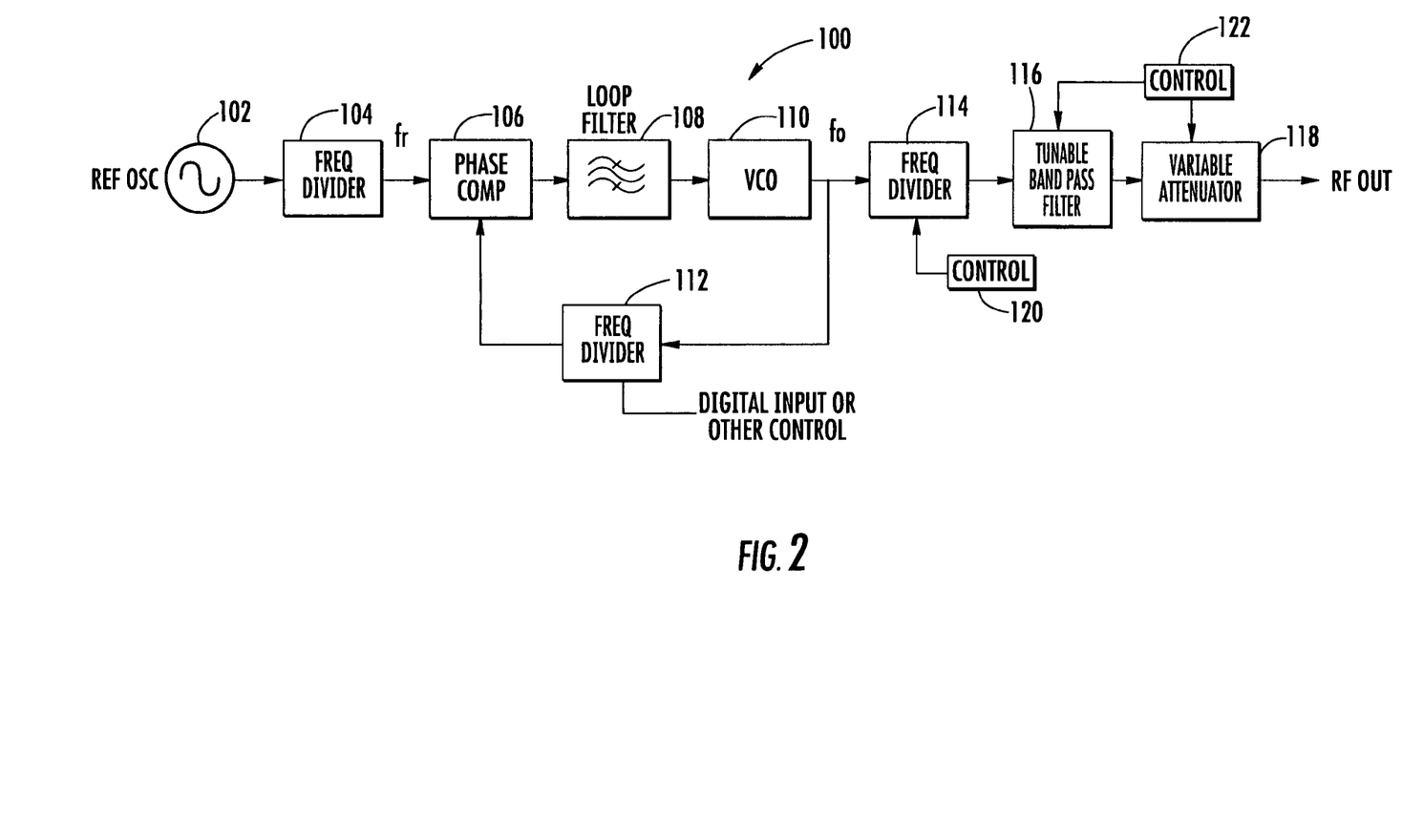
FIG. 2 is a block diagram of a frequency synthesizer in accordance with a non-limiting example of the present invention that uses a frequency divider after the phase-locked loop and a tunable bandpass filter that selects a harmonic frequency to output thus obtaining either an integer or a fractional frequency division for a signal output.

FIG. 2 is a block diagram of a frequency synthesizer 100 in accordance with a non-limiting example of the present invention that overcomes the drawbacks of the frequency synthesizers as described before, including the band split frequency synthesizer shown in FIG. 1B, i.e. size, cost, etc.

This frequency synthesizer 100 introduces a fractional division using a simple integer divide by N divider where N can be an integer (1, 2, 3 . . . ). For example, when the system divides by a number, i.e., 3, and removes the fundamental frequency using a tunable bandpass filter, the second harmonic would be left intact and a 1.5 division is accomplished. Thus, any gaps generated by integer division are filled and a complete coverage of a range of frequencies is provided. The benefit of a bandpass filter as a lower harmonic content of the output signal is accomplished.

As shown in FIG. 2, a reference oscillator 102 produces the reference signal and the reference frequency divider 104 divides the frequency of that signal before the signal enters the phase comparator 106, i.e., the phase detector. The loop filter 108 and voltage controlled oscillator 110 receive the signal, which is fed back through the frequency divider 112 to the phase detector, i.e., phase comparator. In accordance with a non-limiting example of the present invention, the signal that is output from the voltage controlled oscillator 110 passes through an integer frequency divider 114 and tunable bandpass filter 116 and variable attenuator 118. The frequency gaps generated by integer division are filled by such circuit, which provides the advantage of a narrowband voltage controlled oscillator to create a low phase noise, wideband signal that uses less space, costs less and improves the phase noise because of lower phase noise of narrowband VCOs. Fractional division can be applied and the fundamental frequency cancelled to achieve the fractional division of the frequency. The low harmonic content of the output signal as an RF Out alleviates the local oscillator radiation from the mixer stages and provides faster locking times. This frequency synthesizer is a more simple circuit than those circuits using multiple loop schemes. Appropriate control circuits 120, 122 control the frequency divider 114 and adjust the bandpass filter 116 and variable attenuator 118.

The various frequency dividers can divide signals by an integer multiple, for example, by using a Johnson counter as a type of shift register network clocked by an input signal. The last complimented output from the register is fed back to an input of the first register and the output signal is derived from a combination of the register output. It is also possible to use fractional-N dividers as a synthesizer using two integer dividers, a divide-by-N circuit and a divide-by-(N+1) frequency divider. A modulus controller, N, can be toggled between two values so that the voltage controlled oscillator alternates between one locked frequency and the other for the frequency divider 112 in a feedback loop. Thus, by varying the percentage of time the frequency divider spends at the two divider values, the frequency of the locked VCO 110 can be selected with a finer granularity. It is also possible to use a delta-sigma fractional-N synthesizer by randomizing the selection of N and (N+1) while maintaining a time-averaged ratio.

The variable attenuator 118 also reduces the amplitude of power without appreciably distorting the waveform. Thus, the tunable bandpass filter in combination with the variable attenuator allows shaping of the waveform output to a desired configuration in some instances.

Figure 3:
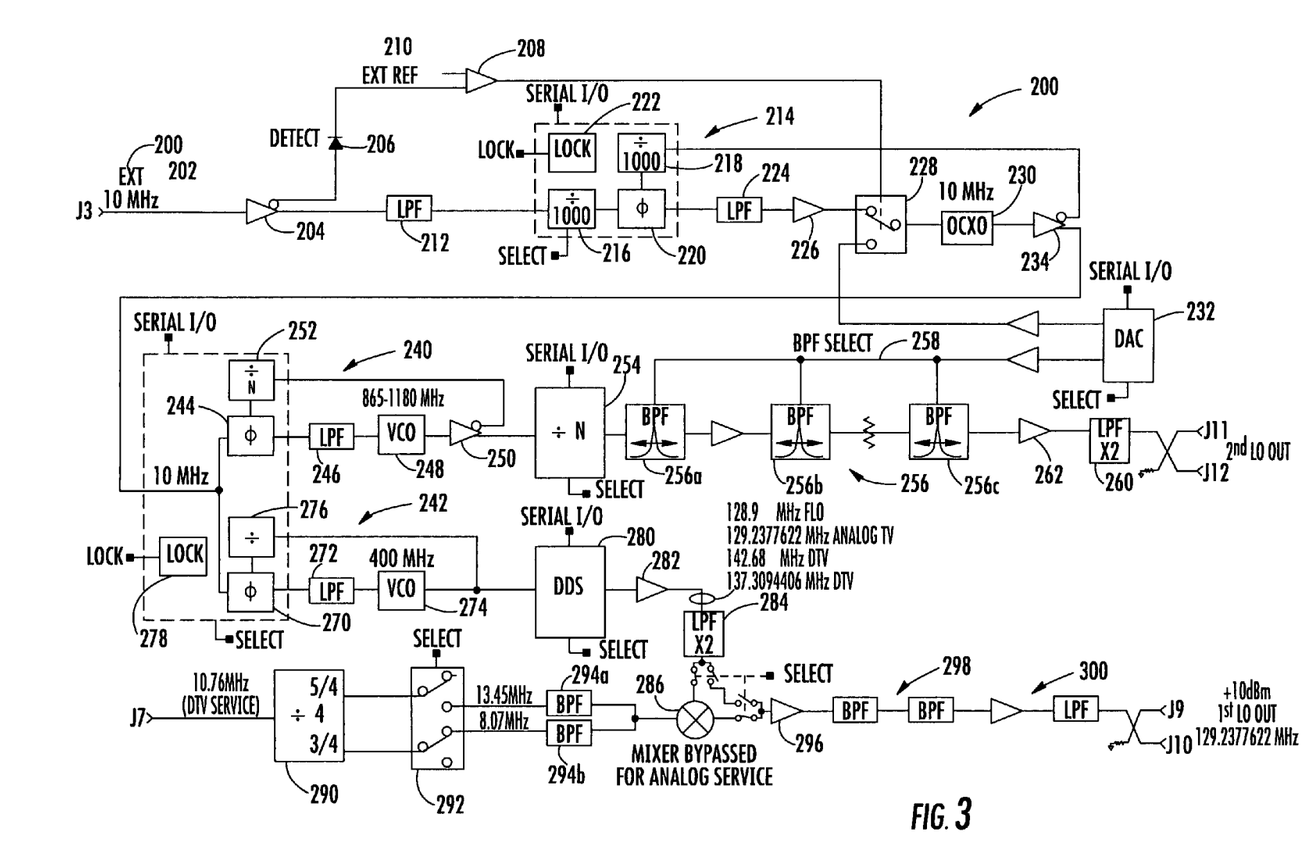
FIG. 3 is a schematic circuit diagram of a frequency synthesizer that produces two local oscillator outputs in accordance with a non-limiting example of the present invention and adapted for use in digital television transmitters to fill the gap in the frequency coverage when a low bandwidth, voltage controlled oscillator is used.
Figure 4:
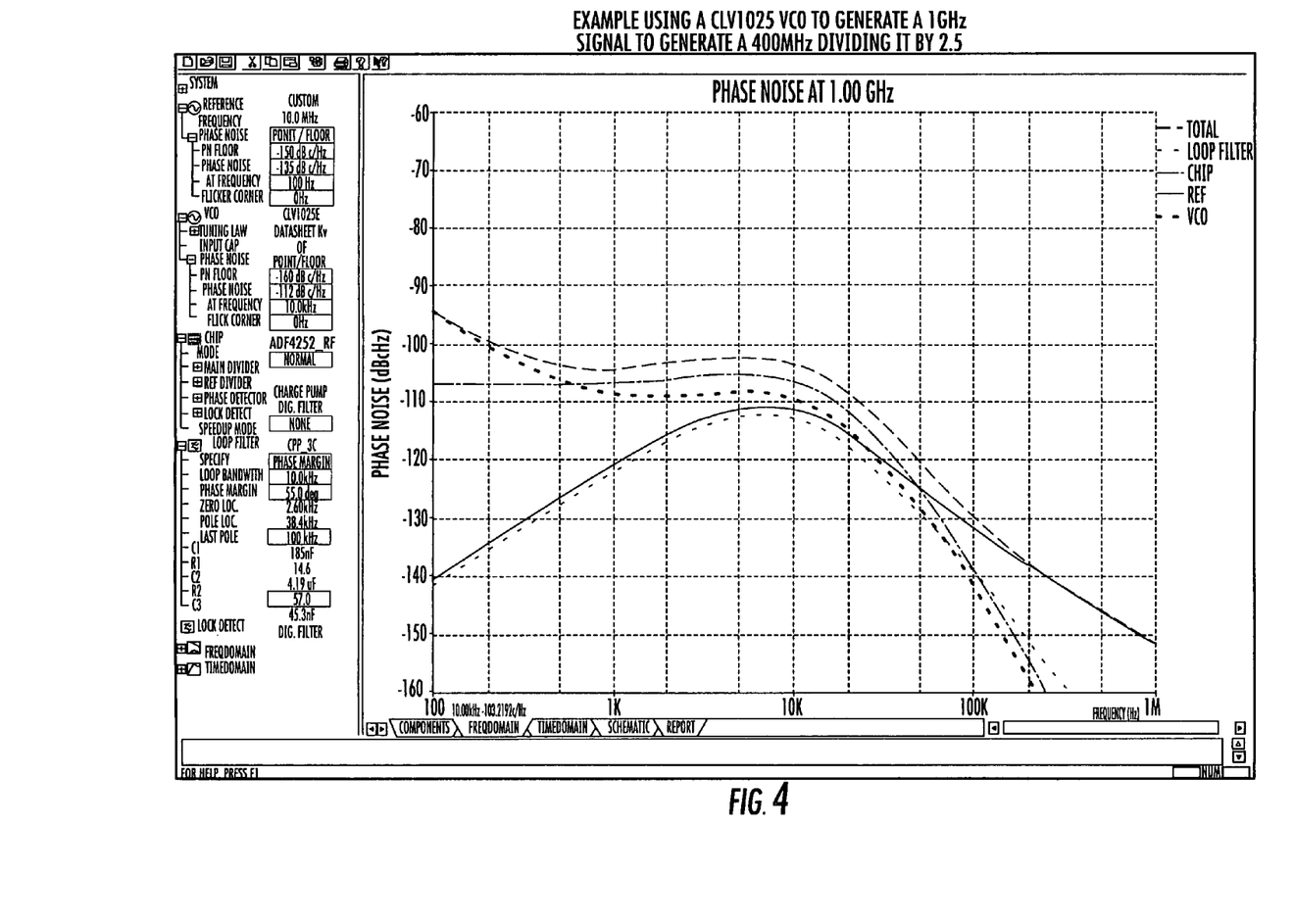
FIG. 4 is a graph showing phase noise results when using a frequency synthesizer in accordance with a non-limiting example of the present invention to generate a 1 GHz signal to generate 400 MHz and divide it by 2.5 note that the actual phase noise at 400 MHz is 20*log(2.5) or 8 dB lower than what is shown in the graph.

FIG. 3 is a schematic circuit diagram showing a frequency synthesizer 200 that can incorporate the components shown in FIG. 2 for use in an exciter as an oscillator for generating the carrier frequency for digital television. An example is an ATSC exciter for digital television (DTV) as manufactured by Harris Corporation of Melbourne, Fla., under the name APEX™, which provides an 8-VSB digital signal with a real-time adaptive correction (RTAC™) system incorporated in the exciter to sample the output of the transmitter's mask filter and continuously monitor the system while making adjustments automatically to maintain the transmitted signal-to-noise well within ATSC recommendations. Such exciters can be used with FLO™ technology and includes adaptive linear and non-linear correction for FLO™ requirements. It is operable with the MediaFLO™ systems such as manufactured by QualComm for high-quality multimedia content to mobile handsets.

The exciter is typically a low power TV transmitter signal source for the ATSC television broadcast service and receives program material to be transmitted in the form of a MPEG-2 transport stream. It generates a low-level on-channel RF signal and performs pre-corrections for signal distortions. This exciter is a single rack mounted chassis with an analog section available from the top of the exciter and the digital section available from the bottom. It is usually mounted in the transmitter on slides, permitting it to be extended forward out of the cabinet for service. The exciter accepts a DTV transport data stream in an embedded clock format. The modulation process is digital with analog circuits used after a digital-to-analog converter to up-convert the IF signal to a desired channel.

A program input to the exciter is a data signal called a "transport stream," which is coded in the SMPTE 310M format and has an impedance of 75 ohms. The clock signal can be recovered from the data stream, instead of requiring separate clock and data paths. The exciter processes the input into the on-channel 8 VSB transmission signal to drive transmitter power amplifiers. The Real-Time Adaptive Correction (RTAC) circuits predistort the exciter RF output to compensate for errors, which occur in the power amplifiers and the high-level RF output intermodulation filter. A crystal oscillator can generate a 43.04 MHz clock signal that is phase-locked to a 19.39 MHz transport clock and divided by four to produce a 10.76 MHz clock. A phase-locked loop board provides a first and second local oscillator signal for an up-converter and RF output amplifier for an exciter RF output.

The frequency synthesizer 200 shown in FIG. 3 can be adapted for use in the systems disclosed in the incorporated by reference '935 and '766 patents. As illustrated, the external 10 MHz signal as an external signal 200, 202 is controlled through a buffer 204 and connects to a detect circuit 206 and associated comparator 208 that receives an external reference 210. The 10 MHz signal passes through the low pass filter 212 and into a reference phase-locked Loop (PLL) circuit 214 that includes a reference and N circuits 216, 218, phase comparator 220 and lock circuit 222, and into another low pass filter 224, operational amplifier 226 and switch 228. The switch 228 is operative for switching between the external reference and a digital reference generated by the DAC 232. The oven controlled crystal oscillator 230 provides a clean 10 MHz reference signal for PLL 240. DAC 232 also provides operational control over the switch and also over tunable bandpass filters and variable attenuator in the wideband frequency synthesizer circuit as will be described below.

The first phase-locked oscillator 214 is operative as a filter and can receive a different input such as a GPS input and lock the external reference to the internal oven controlled crystal oscillator 230, allowing the system to slowly ramp even if the 10 MHz signal as the external reference is lost.

The system is operative with an exciter on-board modulator (not shown) to allow a 24-hour hold over. Even if the external time is lost, the exact time on the frames can be kept for over 24 hours. The oven controlled crystal oscillator 230 helps maintain the frequency stable for a low phase noise oscillator.

As shown, the signal passes from a buffer 234 and the oven controlled crystal oscillator 230 and is feed as a 10 MHz signal into a first phase-locked loop circuit 240 and a second phase-locked loop circuit 242. The first phase-locked loop circuit 240 includes the phase comparator, i.e., phase detector 244, low pass filter 246 as a loop filter, and voltage controlled oscillator (VCO) 248 operative in a wideband frequency range from 865 to 1180 MHz. The signal passes through another buffer 250 and is fed back through the fractional N frequency divider 252 to the phase detector 244 as illustrated.

In this signal chain, the output signal from the first phase-locked loop circuit 244 is frequency divided by divider 254 and is received in the tunable bandpass filter 256 that is controlled by the DAC 232, which outputs control signals along a bandpass filter select line 258. The DAC is operable similar to the control 122 shown in FIG. 2. The bandpass filter includes a plurality of bandpass filters 256a, 256b, 256c that are tunable and adjusted. A low pass filter 260 is operable with an operational amplifier 262 for variable attenuation in conjunction with last bandpass filter 256c. The output is a second local oscillator signal. Thus, this first or top circuit path as described corresponds similar in function to the frequency synthesizer 100 as shown in FIG. 2.

The bottom circuit path includes the second phase-locked loop circuit 242 with its associated phase comparator 270, low pass filter 272 as a loop filter, voltage controlled oscillator 274, and the feedback into the N frequency divider 276. A lock circuit 278 is also provided. Instead of a second frequency divider after the VCO as in the top circuit path, the output from the second phase-locked loop circuit 242 enters a Direct Digital Synthesizer (DDS) 280.

The direct digital synthesizer produces an analog waveform as a sound wave generating the time-varying signal in digital form and performing a digital-to-analog conversion. Although it typically has a purely sinusoidal output, different waveforms and similar sinusoidal output could be produced.

Typically the DDS circuit includes a phase accumulator, a phase-to-amplitude conversion such as a sine look-up table and a D/A converter (DAC). The output frequency usually depends on the reference-clock frequency and binary number programmed into a frequency register as a tuning word. Thus, the DDS as shown in FIG. 3 includes a serial input/output port and select circuit for programming. Its output passes through an operational amplifier 282 and low pass filter 284 into a mixer 286 that can be bypassed for analog service.

In another "chain" of that circuit having the second PLL circuit 242, a 10.76 MHz DTV service signal enters a divide-by-four frequency divider 290 with a 5/4 and 3/4 divide. A switch 292 at the output selects through respective bandpass filters 294a, 294b into the mixer. The output from the mixer 286 passes through amplifier 296 and bandpass filters 298 and into a low pass filter circuit 300 to produce an output for the first local oscillator signal at around 129.2377622 MHz.

The lower path circuit is operative with the second PLL circuit 242, which includes the direct digital synthesizer 280. It operates in conjunction with the switches and allows signal generation through the frequency divider 290 as the 5/4 or 3/4 divider for a 13.45 MHz or 8.07 MHz signal. The system can choose between one or the other. If the 10.76 MHz signal drifts high or low, depending on how the switch is implemented, the system can be locked to the frequency regardless of any drift in the 10.76 signal. According to the DTV specifications, the 10.76 signal could be off by about 54 Hz and the carrier and adjacent channel must not be off by more than 3 Hz in adjacent channel operation. Thus, any pilot signal must be within 3 Hz and the system as described solves this technical problem. Thus, the frequency synthesizer as described maintains the locking of the frequency and even with the mixing of the high and low signals for an up converter.

As illustrated, there are first and second local oscillator outputs. The first local oscillator output on the bottom chain can be used for the first intermediate frequency where the filtering is accomplished via SAW filters. The second local oscillator output can be established to be on-channel and frequency specific to the MediaFLO™ and similar exciter devices.

Figure 5:
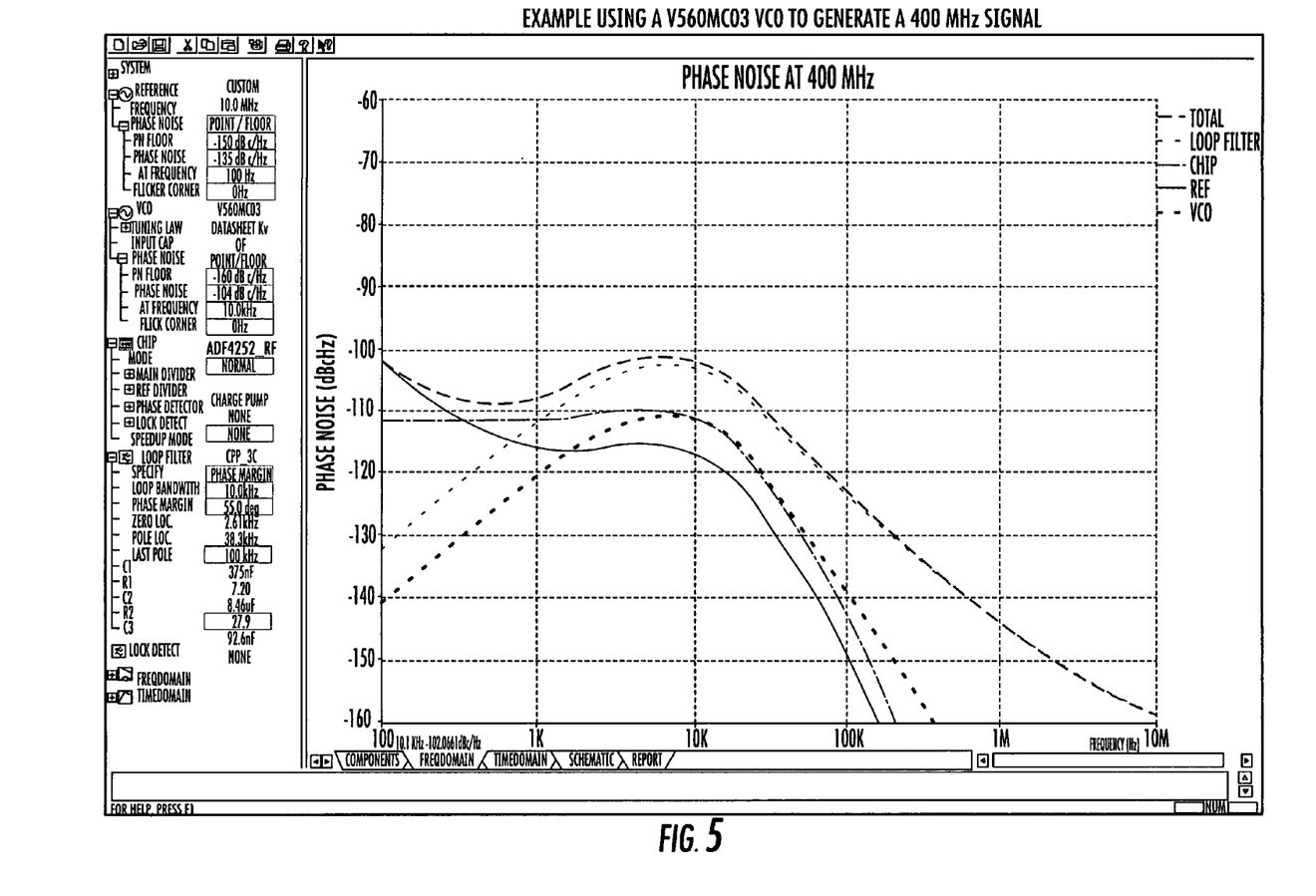
FIG. 5 is a graph showing phase noise results when using a traditional frequency synthesizer design that generates a 400 MHz signal.

FIG. 5 shows an example comparing a frequency synthesizer using a CLV 1025 VCO, in accordance with a non-limiting example of the present invention, to generate a 1 GHz signal to generate a 400 MHz dividing it by 2.5. The graph shows the phase noise of a 1 GHz signal. The largest contributor at 10 KHz is the phase-locked loop chip. The VCO noise is not a significant factor at low frequency offsets. The final phase noise at 10 KHz is −103.2 at 1 GHz, at 400 MHz the phase noise is −103.2−20 log(2.5)=−110.96 dBc/Hz.

The CLV 1025 VCO is a voltage controlled oscillator as manufactured by Z-Communications, Inc. of San Diego, Calif. It has an oscillation range of about 865 to about 1180 MHz and −112 phase noise at 10 KHz offset.

FIG. 5 shows an example using a V560MCO3 VCO such as manufactured by Z-Communications, Inc. to generate a 400 MHz signal Using traditional methods. The largest contributor at 10 KHz is the VCO and the PLL chip noise is not a significant factor at the 10 KHz offset. The final phase noise at 10 KHz is −102 dBc/Hz. The V560MCO3 VCO has an oscillation frequency range of about 400 to about 800 and a phase noise of −104.

It should be understood that improvements are realized as the PLL loop bandwidth is narrowed because the VCO noise becomes a larger factor in the total output noise. A side benefit is that with higher frequencies, there is no prescaler restriction on using a reference doubler circuitry such as available on the latest PLL chips. For example, a chip such as the ADF4252 as manufactured by Analog Devices as a dual fractional-N-integer-N frequency synthesizer requires a minimum divide-by-N of 31 to take advantage of the reference doubler. This circuit includes both RF and IF synthesizers that use a low noise digital PFD (phase frequency detector), a precision charge pump and a programmable reference divider.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A frequency synthesizer, comprising:
a phase-locked loop circuit comprising a phase detector and a voltage controlled oscillator connected thereto and a feedback loop extending from the voltage controlled oscillator to the phase detector and a frequency divider positioned within the feedback loop, and a phase-locked loop output at the voltage controlled oscillator through which an RF signal is generated at a first frequency;
an integer frequency divider connected to the phase-locked loop output and operative to receive the signal therefrom and to divide the first frequency of the signal output from the phase-locked loop circuit by an integer number; and
a tunable bandpass filter connected to said integer frequency divider that is configured to tune the bandpass filter to remove a fundamental frequency and select a harmonic frequency to obtain a fractional frequency division for the signal output from the phase-locked loop circuit.

2. The frequency synthesizer according to claim 1, wherein said tunable bandpass filter is operative to remove a fundamental frequency and leave the rest intact.

3. The frequency synthesizer according to claim 1, wherein said tunable bandpass filter comprises a plurality of serially connected and tunable bandpass filters.

4. The frequency synthesizer according to claim 3, and further comprising a bandpass filter select circuit operatively connected to each of said tunable bandpass filters for controlling said bandpass filters for tuning the bandpass filter to a fundamental harmonic frequency.

5. The frequency synthesizer according to claim 1, and further comprising a variable attenuator connected to said tunable bandpass filter.

6. The frequency synthesizer according to claim 5, wherein said variable attenuator comprises a filter circuit operable with said tunable bandpass filter to shape said signal.

7. The frequency synthesizer according to claim 1, and further comprising a reference signal source and reference frequency divider connected to said phase detector and operative to impart a desired channel spacing.

8. A method for generating wideband low phase noise signals, comprising:
receiving a reference signal within a phase-locked loop circuit comprising a phase detector and a voltage controlled oscillator and a feedback loop extending from the voltage controlled oscillator to the phase detector and a frequency divider positioned within the feedback loop, and a phase-locked loop output at the voltage controlled oscillator through which an RF signal is output;
generating at the phase-locked loop output an RF signal at a first frequency;

dividing by an integer number the first frequency of the signal output from the phased-lock loop circuit within an integer frequency divider; and tuning a tunable bandpass filter to remove a fundamental frequency and select a harmonic frequency of the signal that has been divided to obtain an integer or fractional frequency division for the signal output from the phased-lock loop circuit.

9. The method according to claim 8, which further comprises removing a harmonic frequency and leaving the rest intact.

10. The method according to claim 8, which further comprises series connecting a plurality of tunable bandpass filters together to form a bandpass filter that selects a harmonic frequency.

11. The method according to claim 8, which further comprises imparting a desired channel spacing by dividing the reference signal within a frequency divider.

* * * * *